(12) United States Patent
Park et al.

(10) Patent No.: US 7,193,876 B1
(45) Date of Patent: Mar. 20, 2007

(54) CONTENT ADDRESSABLE MEMORY (CAM) ARRAYS HAVING MEMORY CELLS THEREIN WITH DIFFERENT SUSCEPTIBILITIES TO SOFT ERRORS

(76) Inventors: Kee Park, 881 Hampswood Way, San Jose, CA (US) 95120; Scott Yu-Fan Chu, 638 Plaza Inviero, San Jose, CA (US) 95111

(*) Notice: Subject to any disclaimer, the term of this patent is extended or adjusted under 35 U.S.C. 154(b) by 0 days.

(21) Appl. No.: 11/181,534

(22) Filed: Jul. 14, 2005

Related U.S. Application Data (63) Continuation-in-part of application No. 10/738,264, filed on Dec. 17, 2003, now Pat. No. 6,987,684, which is a continuation-in-part of application No. 10/701,048, filed on Nov. 4, 2003, now Pat. No. 6,967,856, and a continuation-in-part of application No. 10/619,635, filed on Jul. 15, 2003, now Pat. No. 6,870,749.

(51) Int. Cl.
G11C 15/00 (2006.01)
(52) U.S. Cl. .................... 365/49; 365/189.07; 365/200
(58) Field of Classification Search ................. 365/49, 365/189.07, 200, 189.09
See application file for complete search history.

(56) References Cited

U.S. PATENT DOCUMENTS

| | | | |
|---|---|---|---|
| 3,665,422 A | 5/1972 | McCoy et al. ............... | 365/222 |
| 4,112,502 A | 9/1978 | Scheuneman ............... | 364/900 |
| 4,747,080 A | 5/1988 | Yamada ....................... | 365/200 |
| 4,779,226 A | 10/1988 | Haraszti | |
| 4,791,606 A | 12/1988 | Threewitt et al. | |
| 4,862,412 A * | 8/1989 | Fried et al. .................... | 365/49 |
| 4,903,268 A | 2/1990 | Hidaka et al. | |
| 4,958,352 A | 9/1990 | Noguchi et al. | |
| 4,991,136 A | 2/1991 | Mihara | |
| 5,046,046 A | 9/1991 | Sweha et al. | |
| 5,127,014 A | 6/1992 | Raynham | |
| 5,184,325 A | 2/1993 | Lipovski ..................... | 365/222 |
| 5,233,614 A | 8/1993 | Singh | |
| 5,319,589 A | 6/1994 | Yamagata et al. | |
| 5,450,424 A | 9/1995 | Okugaki et al. | |
| 5,455,834 A | 10/1995 | Chang et al. | |
| 5,469,450 A | 11/1995 | Cho et al. | |
| 5,491,703 A | 2/1996 | Barnaby et al. ........... | 371/40.1 |
| 5,561,429 A | 10/1996 | Halberstam et al. | |
| 5,570,377 A | 10/1996 | Merino Gonzalez et al. | |
| 5,572,460 A | 11/1996 | Lien | |
| 5,604,753 A | 2/1997 | Bauer et al. | |
| 5,629,950 A | 5/1997 | Godiwala et al. | |
| 5,642,320 A | 6/1997 | Jang .......................... | 365/222 |

(Continued)

OTHER PUBLICATIONS

Sibercore Technologies, Soft Error in TCAMS: Causes and Cures, Jul. 2003, 5 pages.

(Continued)

*Primary Examiner*—David Lam
(74) *Attorney, Agent, or Firm*—Myers Bigel Sibley & Sajovec PA (57) ABSTRACT

A CAM array has at least one row therein containing a plurality of memory cells with different susceptibilities to soft errors. The memory cells having reduced susceptibilities to soft errors include those used in check bit cells and/or CAM cells containing valid bit data and/or force no-hit data. Additional memory cells may also be provided with somewhat greater susceptibilities to soft errors and somewhat more aggressive design rules (e.g., smaller layout area). These additional memory cells may include those used in ternary CAM cells (e.g., XY CAM cells) within the row.

12 Claims, 8 Drawing Sheets

U.S. PATENT DOCUMENTS

| | | | |
|---|---|---|---|
| 5,644,583 A | 7/1997 | Garcia et al. | |
| 5,682,394 A | 10/1997 | Blake et al. | |
| 5,699,369 A | 12/1997 | Guha | |
| 5,724,296 A | 3/1998 | Jang | |
| 5,727,003 A | 3/1998 | Zook | |
| 5,761,222 A | 6/1998 | Baldi | |
| 5,796,671 A | 8/1998 | Wahlstrom | |
| 5,796,758 A | 8/1998 | Levitan | 371/49.1 |
| 5,872,802 A | 2/1999 | Knaack et al. | 371/49.1 |
| 6,009,548 A | 12/1999 | Chen et al. | |
| 6,032,214 A | 2/2000 | Farmwald et al. | |
| 6,058,500 A | 5/2000 | DesJardins et al. | |
| 6,067,656 A | 5/2000 | Rusu et al. | 714/768 |
| 6,134,631 A | 10/2000 | Jennings, III | |
| 6,137,707 A | 10/2000 | Srinivasan et al. | |
| 6,151,247 A | 11/2000 | Estakhri et al. | |
| 6,154,384 A | 11/2000 | Nataraj et al. | 365/49 |
| 6,188,629 B1 | 2/2001 | Kaplinsky | |
| 6,199,140 B1 | 3/2001 | Srinivasan et al. | |
| 6,216,246 B1 | 4/2001 | Shau | |
| 6,219,815 B1 | 4/2001 | DesJardins et al. | |
| 6,233,717 B1 | 5/2001 | Choi | |
| 6,243,281 B1 | 6/2001 | Pereira | 365/49 |
| 6,289,471 B1 | 9/2001 | Gordon | |
| 6,324,087 B1 | 11/2001 | Pereira | 365/49 |
| 6,362,990 B1 | 3/2002 | Gibson et al. | 365/49 |
| 6,374,325 B1 | 4/2002 | Simpson et al. | |
| 6,381,191 B2 | 4/2002 | Ooishi | |
| 6,397,290 B1 | 5/2002 | Williams et al. | |
| 6,408,417 B1 | 6/2002 | Moudgal et al. | |
| 6,421,265 B1 | 7/2002 | Lien et al. | 365/49 |
| 6,430,073 B1 | 8/2002 | Batson et al. | 365/49 |
| 6,434,033 B1 | 8/2002 | Chien | |
| 6,445,628 B1 | 9/2002 | Pereira et al. | |
| 6,477,615 B1 | 11/2002 | Tanaka | |
| 6,538,911 B1 | 3/2003 | Allan et al. | 365/49 |
| 6,542,391 B2 | 4/2003 | Pereira et al. | 365/49 |
| 6,560,156 B2 | 5/2003 | Lien et al. | 365/222 |
| 6,563,754 B1 | 5/2003 | Lien et al. | 365/222 |
| 6,597,595 B1 | 7/2003 | Ichiriu et al. | 365/49 |
| 6,618,281 B1 | 9/2003 | Gordon | 365/49 |
| 6,661,687 B1 | 12/2003 | Lien et al. | |
| 6,690,595 B1 | 2/2004 | Srinivasan | 365/49 |
| 6,700,810 B1 | 3/2004 | Ichiriu et al. | 365/49 |
| 6,700,827 B2 | 3/2004 | Lien et al. | |
| 6,707,693 B1 | 3/2004 | Ichiriu et al. | |
| 6,711,703 B2 | 3/2004 | MacLaren et al. | |
| 6,715,116 B2 | 3/2004 | Lester et al. | |
| 6,728,124 B1 | 4/2004 | Ichiriu et al. | |
| 6,741,253 B2 | 5/2004 | Radke et al. | |
| 6,754,093 B2 | 6/2004 | Lien | |
| 6,760,881 B2 | 7/2004 | Batson et al. | |
| 6,775,168 B1 | 8/2004 | Park et al. | |
| 6,807,081 B2 * | 10/2004 | Nii | 365/145 |
| 6,845,472 B2 | 1/2005 | Walker et al. | |
| 6,870,749 B1 | 3/2005 | Park et al. | |
| 6,879,504 B1 * | 4/2005 | Lien et al. | 365/49 |
| 6,888,732 B2 | 5/2005 | Hu | |
| 6,978,343 B1 * | 12/2005 | Ichiriu | 365/49 |
| 2002/0067632 A1 | 6/2002 | Batson et al. | |
| 2002/0075714 A1 | 6/2002 | Pereira et al. | 365/49 |
| 2002/0159320 A1 | 10/2002 | Lien et al. | |
| 2003/0007408 A1 | 1/2003 | Lien et al. | 365/222 |
| 2003/0074630 A1 | 4/2003 | Batson et al. | 714/805 |
| 2003/0081464 A1 | 5/2003 | Vlasenko | 365/200 |

OTHER PUBLICATIONS

Halsall, Fred, "Data Communications, Computer Networks and OSI," Second Edition, 11 pages, no date.

Fourouzan, Behrouz, "Introduction to Telecommunications and Networking," Chapter 8, pp. 194-226, no date.

Kalter et al., "A 50-ns 16-Mb DRAM with a 10-ns Data Rate and On-Chip ECC," IEEE Journal of Solid-State Circuit, vol. 2, No. 5, Oct. 1990, pp. 1118-1127.

* cited by examiner

CONTENT ADDRESSABLE MEMORY (CAM) ARRAYS HAVING MEMORY CELLS THEREIN WITH DIFFERENT SUSCEPTIBILITIES TO SOFT ERRORS

REFERENCE TO PRIORITY APPLICATIONS

This application is a continuation-in-part (CIP) of U.S. application Ser. No. 10/733,264, filed Dec. 17, 2003, now U.S. Pat. No. 6,987,684, which is a continuation-in-part (CIP) of U.S. application Ser. No. 10/619,635, filed Jul. 15, 2003, now U.S. Pat. No. 6,870,749, and a continuation-in-part (CIP) of U.S. application Ser. No. 10/701,048, filed Nov. 4, 2003, now U.S. Pat. No. 6,967,856, the disclosures of which are hereby incorporated herein by reference.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., assigned to the present assignee, the disclosures of which are hereby incorporated herein by reference.

CAM cells are frequently configured as binary CAM cells that store only data bits (as "1" or "0" logic values) or as ternary (or quaternary) CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}. As will be understood by those skilled in the art, conventional "quaternary" CAM cells, which have four valid combinations of states: ((data=0, mask=active), (data=1, mask=active), (data=0, mask=inactive), (data=1, mask=inactive)), are frequently treated as "ternary" CAM cells because two of the four states represent an equivalent active mask condition. In contrast, ternary CAM cells may include CAM cells having two bits of data that are configurable in only three valid combinations: ((0,1)=0, (1,0)=1, (0,0)=mask and (1,1)=invalid). Both types of cells will be referred to herein as ternary CAM cells.

CAM devices may also use coding techniques to detect and correct one-bit soft errors in entries within a CAM array. One such CAM device that uses a parity comparator to detect errors is described in U.S. Pat. No. 6,067,656 to Rusu et al., entitled "Method and Apparatus for Detecting Soft Errors in Content Addressable Memory Arrays." Another such CAM device that uses dynamic content addressable memory (DCAM) cells is disclosed in U.S. Pat. No. 6,430,073 to Batson et al., entitled "DRAM CAM Cell with Hidden Refresh." In particular, the '073 patent discloses a technique for performing hidden refresh of dynamic CAM entries using non-destructive read operations that may be performed during match line (ML) precharge operations. Upon reading, the entries may be checked for errors and possibly corrected before undergoing a refresh write operation.

Figure 1:
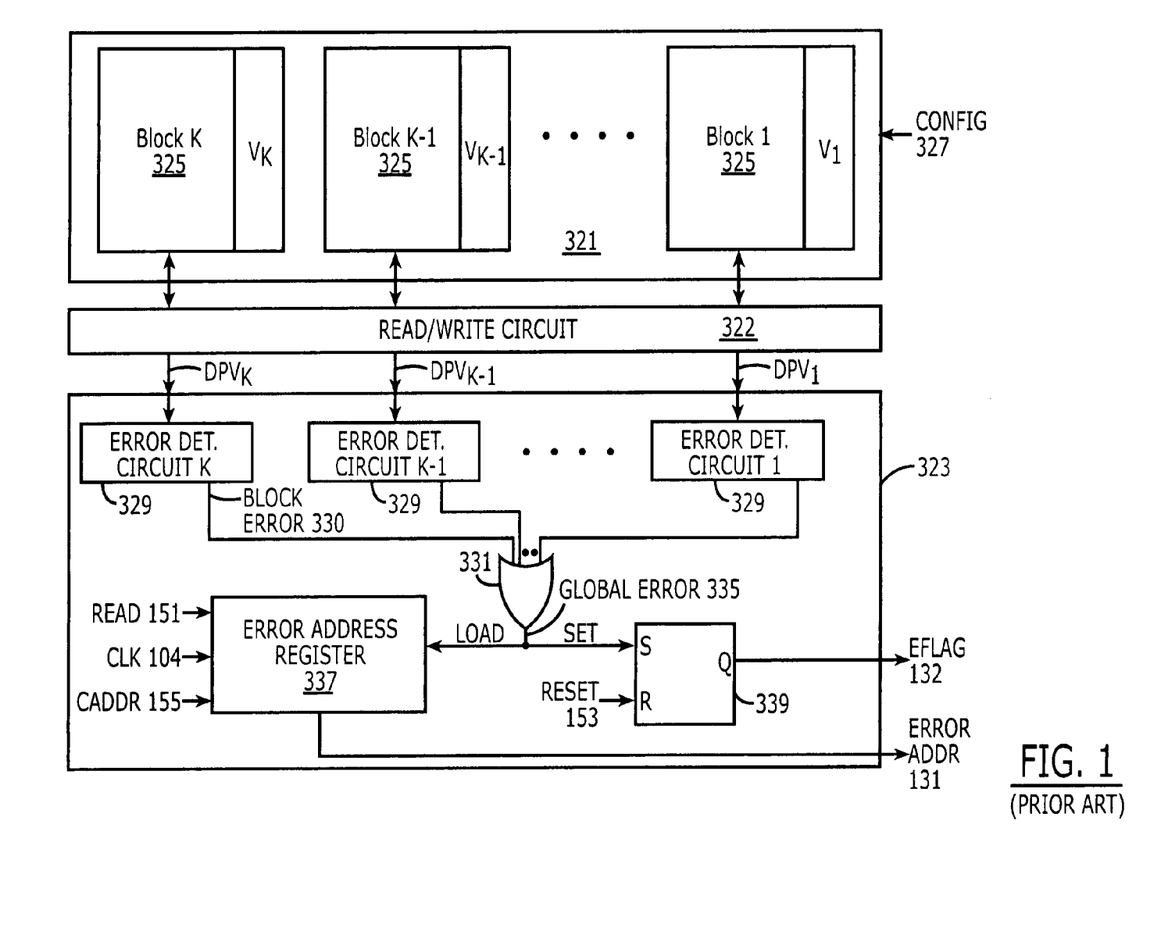
FIG. 1 is a block diagram of a conventional content addressable memory (CAM) device having parity-based error detection circuits therein.

U.S. Pat. No. 6,597,595 to Ichiriu et al. discloses a CAM device that performs error detection signaling operations. These error detection signaling operations are described as background error checking operations that consume little if any compare bandwidth. This is because any operation to read an entry from a CAM array for error checking purposes may be performed concurrently with the performance of compare operations on the same CAM array. As illustrated by FIG. 1, which is a reproduction of FIG. 10 from the '595 patent, a CAM array 321 is provided with multiple storage blocks 325 (shown as Blocks 1–K). In response to a read operation from a check address 155 (CADDR) within the CAM array 321, data, parity and validity values (shown as $DPV_1$ through $DPV_K$) are passed through a read/write circuit 322 into a parity-based error detector 323. This parity-based error detector is illustrated as including a plurality of error detection circuits 329. This check address 155 may be supplied by a check address generator (see, e.g., Block 124 in FIG. 2 of the '595 patent). Each of these error detection circuits 329 performs a parity-based error detection operation on a corresponding data word and generates a respective block parity error signal 330 (BLOCK ERROR). These block parity error signals 330 may be logically ORed by an OR gate 331 into a global parity error signal 335 (GLOBAL ERROR). The global parity error signal 335 is provided as a load input to an error address register 337 and as a set input to an S-R flip-flop 339. Whenever a block parity error is signaled by any of the error detection circuits 329, the resulting global parity error signal 335 is used to load the check address 155 into the error address register 337 and to set the S-R flip-flop 339. The S-R flip-flop 339 can be reset by driving a reset signal 153 (RESET) high. The error address register 337 is also illustrated as receiving a read signal 151 (READ) and a clock signal 104 (CLK). The error address register 337 and the S-R flip-flop 339 are configured to output an error address 131 (ERROR ADDR) and an error flag (EFLAG) 132. The error detector 323 may also include circuitry (not shown) to store a value indicative of which of the error detection circuits has signaled a block error. This value, referred to as a block identifier, may be stored along with the check address 155 in the error address register 337. The block identifier may then be output from the error address register 337 (as part of the error address) to thereby enable a host or other circuitry within the CAM device to identify the block or blocks within the CAM array 321 that produced the error indication.

Figure 2:
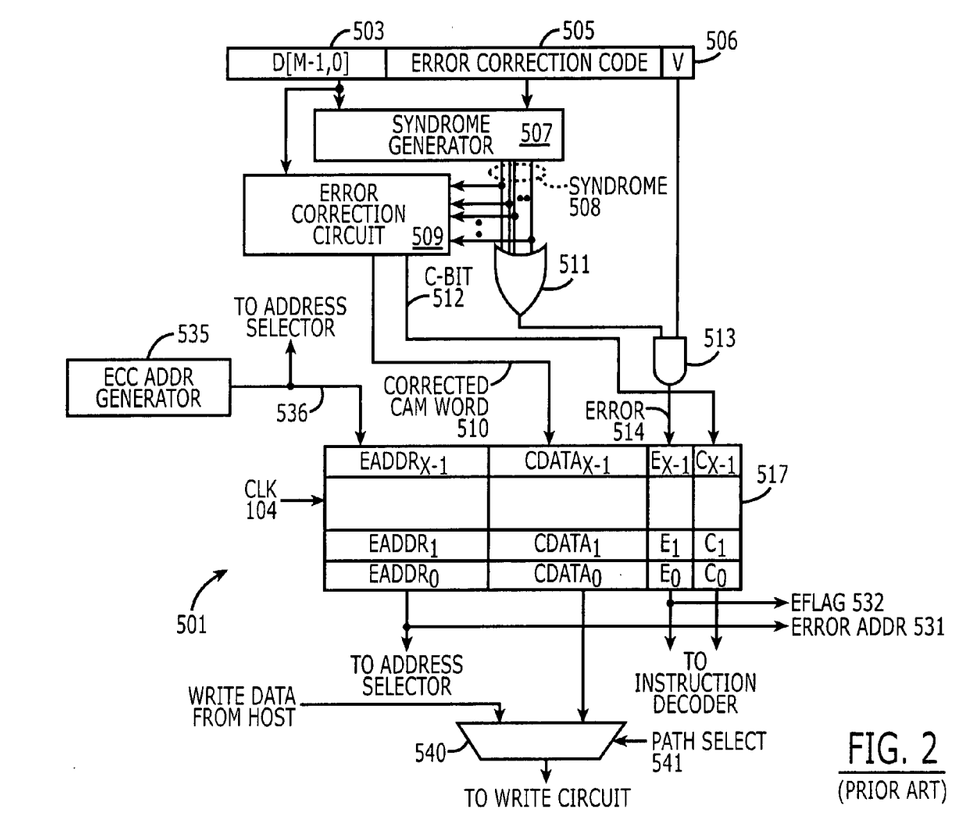
FIG. 2 is a block diagram of a conventional content addressable memory (CAM) device having an error correction circuit therein.

Referring now to FIG. 2, which is a reproduction of FIG. 16 from the '595 patent, an alternative error detector 501 is illustrated. This error detector 501 is an error detector/corrector that uses a more complex error correction code instead of parity bit(s). At the top of FIG. 2, a CAM entry is illustrated as including a data word 503, shown as data D[M−1,0], an error correction code word 505 (e.g., Hamming code word) and a validity bit 506 (V). This CAM entry resides at the error address 536 (EADDR) specified by an ECC address generator 535. This error address 536 may be provided to an address selector (see, e.g., Block 125 in FIG. 2 of the '595 patent). As will be understood by those skilled in the art, in order to enable one bit error correction within a data word having a length of M bits, the error correction code word 505 should have a length equal to "c" bits, where the length "c" meets the following relationship: $2^c \geq M+c+1 \geq 2^{c-1}$. In response to a read operation, the data word 503 and error correction code word 505 are provided to a syndrome generator 507, which generates a syndrome 508 (i.e., parity check vector). The bits of the syndrome 508 are logically ORed using an OR gate 511 to generate a result signal that indicates whether an error is present in the CAM entry. This result signal is provided to an input of a AND gate 513, which also receives the validity bit signal 506. If the CAM entry is valid (i.e., V=1), then an error signal 514 (ERROR) may be generated at the output of the AND gate 513 whenever the result signal indicates the presence of an error. An error correction circuit 509 is also provided. The error correction circuit 509 receives the data word 503 and syndrome 508. If the error represents a single bit error that can be corrected, then the error correction circuit 509 generates a C-bit signal 512 (C-BIT), which indicates whether a correction has taken place, and a corrected CAM word 510 (data word and error correction code word). At the end of each error detection operation, the error address 536 (EADDR), corrected CAM word 510 (CDATA), error signal 514 (E) and C-bit signal 512 (C) are stored within an error address register 517, which is responsive to a clock signal 104. The error signals 514 and error addresses 536 that are stored within the error address register 517 may be used to generate an error flag 532 (EFLAG) and error address 531 (EADDR), which may be used to support background self-invalidation operations (see, e.g., FIG. 14 of the '595 patent). A write data multiplexer 540, which is responsive to a path select signal 541, is also provided so that a corrected CAM word ($CDATA_0$–$CDATA_{X-1}$) may be written back into a CAM array at an address specified by the corresponding error address ($EADDR_0$–$EADDR_{X-1}$).

Notwithstanding the disclosure of the '595 patent, the performance of a background operation to read an entry from a CAM array while a foreground compare operation is being performed concurrently on the same CAM array may impact the reliability of the compare operation. This is because the performance of a read operation on a row of CAM cells within a CAM array may operate to "stress" the memory elements within the row of CAM cells and cause the logic levels of signals within the memory elements to fluctuate. Such fluctuations can represent a significant disturbances to the outputs of the memory elements, particularly if the CAM cells are powered at low voltage levels (e.g., Vdd=1 Volt), and may result in erroneous compare operations. Accordingly, it may be more advantageous to perform read operations for error checking purposes as foreground operations that consume at least some degree of compare bandwidth.

Unfortunately, if the read operations used for error checking purposes in the error detector/corrector 501 of FIG. 2 are performed as foreground operations, then substantial compare bandwidth will likely be consumed as the ECC address generator 535 sequentially steps through the address of each CAM entry within an entire CAM core looking for errors to be corrected. To remedy this performance limitation associated with the error detector/corrector 501 of FIG. 2, a duplicate error detector/corrector 501 could be provided for each CAM storage block in the CAM core. However, unlike parity-based error detectors, which can be made relatively small, the use of an error detector/corrector 501 with each CAM storage block can be expected to consume a substantial amount of layout area and considerably increase power consumption requirements.

SUMMARY OF THE INVENTION

Search engine devices according to embodiments of the present invention include a content addressable memory (CAM) core having a plurality of CAM array blocks therein and a control circuit that is electrically coupled to the CAM core. The control circuit may include, among other things, an instruction FIFO, instruction loading and execution logic and check bit generation and error correction logic. Alternatively, the instruction loading and execution logic may perform instruction pipelining operations that eliminate the need for an instruction FIFO, or the instruction loading and execution logic may be configured to support no-op cycle generation even when the instruction FIFO is partially full. The control circuit is configured to support internal error detection and correction operations that can operate without significant impact on the compare bandwidth of the search engine device, even when operations to read entries from the CAM core are performed as foreground operations that may block concurrent search operations. The control circuit may perform the error detection and correction operations by issuing multiple read instructions. These instructions include a first instruction (e.g., error check instruction) to read at least a first entry within the CAM core for the purpose of error detection and then, in response to detecting the first entry as erroneous, issuing a second instruction to read the first entry from the CAM core.

In particular, the first read operation may be performed as a "high bandwidth" error checking operation that causes many CAM entries to be read in parallel from a plurality of CAM array blocks and checked in parallel for parity errors. The second read operation (or sequence of read operations) is a much more selective operation because it is directed at only those entries that have already been detected as erroneous. In many instances, the second read operation will not need to be performed because many of the first "high bandwidth" read operations will result in the detection of no errors in a group of CAM entries.

To respond to the second read operation, an erroneous entry is transferred to the error correction logic within the control circuit. The error correction logic may operate to detect the presence of one or more errors (e.g, 2–4 errors) within the entry and, if possible, correct the entry. In a typical embodiment, the error correction logic may be configured to detect as many as four errors within an entry and correct one error within the entry. If two or more errors are present and cannot be corrected, then the search engine device may notify a command host of the erroneous entry and the corresponding entry may be invalidated within the CAM core. This notification operation may also include notification of all entries detected as erroneous, even if they are subject to correction within the search engine device.

The ability to detect a high number of errors within an entry and also correct the entry without requiring a check word having an excessive number of check bits is achieved using a modified Hamming code word that combines parity and non-parity check bits. In particular, the Hamming code word may consist of P parity bits and H non-parity bits, where H is a positive integer greater than one and P is a positive even integer greater than two and the following relationship is met: $2^{(H+1/2P)} \geq N+H+\frac{1}{2}P+1 \geq 2^{(H+1/2P-1)}$, where N is a length of the data word (including validity bit, etc.).

Further embodiments of the present invention include methods of operating a CAM-based search engine device. These methods include issuing a parity check instruction and a multi-block row address to a CAM core within a search engine device. This instruction may be issued in response to detecting a presence of a no-op cycle within an instruction pipeline within the search engine device. In response to this instruction, a plurality of entries may be read in parallel from a plurality of CAM array blocks within the CAM core. A local parity check operation is then performed on the plurality of entries in order to detect a presence of at least a first entry in the plurality of entries that is erroneous. This operation may also include the generation of an error indication word at a read data port of the CAM core. The error indication word may be encoded so that each bit of the word indicates whether or not a corresponding one of the plurality of entries is erroneous.

In response to this detection, an internally generated instruction is issued to read the first entry from the CAM core. This instruction causes a "second" reading of the first entry from the CAM core into error correction logic within the search engine device. The first entry is then corrected within the search engine device using an error correction code that is held by the first entry. Once corrected, the first entry is rewritten into the CAM core. The latter operations are repeated until all entries that have been detected as erroneous are corrected. Once all erroneous entries have been corrected, the multi-block row address is incremented and another parity-check instruction is issued to the CAM core to repeat the error checking and correcting operations.

Still further embodiments of the invention include integrated circuit devices having at least one CAM array therein. This CAM array includes a plurality of rows of memory elements. These memory elements may define the memory elements for ternary and/or binary CAM cells as well as check bit cells. The check bit cells may be dedicated check bit cells (without compare logic) or dual-function check bit cells (with compare logic). The CAM array has at least one row therein containing a plurality of memory cells with different susceptibilities to soft errors. The memory cells having reduced susceptibilities to soft errors include those used in check bit cells (with larger latching inverters) and/or CAM cells (e.g., binary CAM cells with larger storage node capacitance) containing valid bit data and/or force no-hit data. Additional memory cells may also be provided with somewhat greater susceptibilities to soft errors and somewhat more aggressive design rules (e.g., smaller layout area). These additional memory cells may include those used in ternary CAM cells (e.g., XY CAM cells) within the row. An XY CAM cell may include two memory cells having equivalent susceptibilities to soft errors.

The CAM cells configured to store valid bit data values and/or force no-hit data values may be configured as binary CAM cells. Each of these binary CAM cells may include a pair of inverters electrically coupled in antiparallel. First and second access transistors are also provided. The first access transistor has a drain terminal electrically coupled to an input of a first one of the pair of inverters and the second access transistor has a drain terminal electrically coupled to an input of a second one of the pair of inverters. First and second dummy access transistors are also provided. The first dummy access transistor has a drain terminal electrically coupled to the input of the second one of the pair of inverters and a source terminal electrically coupled to a source terminal of the first access transistor. The second dummy access transistor has a drain terminal electrically coupled to the input of the first one of the pair of inverters and a source terminal electrically coupled to a source terminal of the second access transistor. The compare logic circuit within the CAM cell includes a first NMOS transistor having a gate terminal electrically coupled to the input of the first one of the pair of inverters and a second NMOS transistor having a gate terminal electrically coupled to the input of the second one of the pair of inverters. The compare logic circuit may include eight transistors (e.g., 4 PMOS transistors and 4 NMOS transistors) arranged as two totem poles, with each totem pole including two PMOS transistors and two NMOS transistors.

DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 3:
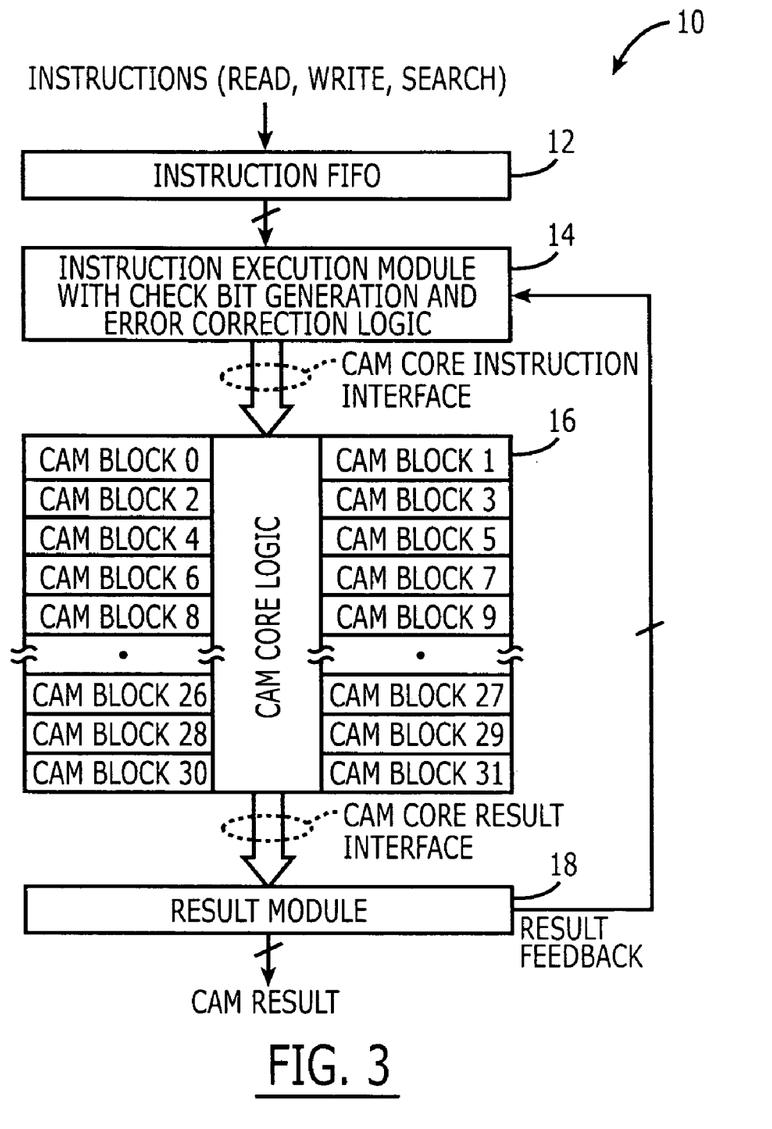
FIG. 3 is a block diagram of a search engine device according to embodiments of the present invention.
Figure 4A:
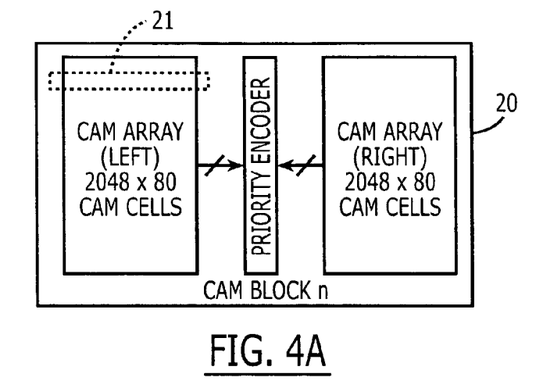
FIG. 4A illustrates a CAM array blocking having a pair of CAM arrays therein, according to embodiments of the present invention.

FIG. 3 is a block diagram of a search engine device 10 according to a first embodiment of the present invention. This search engine device 10 is illustrated as including an instruction buffer 12, which may be configured as a first-in first-out (FIFO) memory device, however, other conventional logic may be used to incorporate received instructions into an instruction pipeline. The instruction buffer 12 is configured to receive instructions (e.g., read, write and search) that are compatible with operations performed by a content addressable memory (CAM) core 16. This CAM core 16 is illustrated as including 32 CAM array blocks and CAM core logic. As illustrated by FIG. 4A, each CAM array block 20 may include a pair of CAM arrays that are separated by a priority encoder. These CAM arrays are shown as having a capacity of 2048×80 bits for a CAM core having a capacity of 10 Meg. Each 80 bit entry 21 may be configured as illustrated by FIG. 4B.

The instructions provided to the instruction buffer 12 may be generated by a command host (not shown), such as a network processing unit (NPU), and received by an instruction mapped interface (not shown) of the search engine device 10. The search engine device 10 is also illustrated as including an instruction execution module 14 having instruction loading and execution logic therein. This instruction execution module 14 performs operations of a finite state machine (FSM), including, among other things, instruction scheduling and arbitration. As illustrated, the instruction execution module 14 may issue instructions to the CAM core 16 via an instruction interface. In response, the CAM core 16 performs operations and generates results that are provided to a result module 18 via a CAM core result interface. Some of these results may be processed by the result module 18 and passed to results mailboxes (not shown), for subsequent reporting to the command host, or passed to a results bus for immediate reporting. Other results may be fed back to the instruction execution module 14, as illustrated. A detailed description of operations performed by the instruction buffer 12, instruction execution module 14 and result module 18 is also provided in commonly assigned U.S. application Ser. No. 10/721,036, filed Nov. 21, 2003, the disclosure of which is hereby incorporated herein by reference. These devices, which surround the CAM core 16 on an integrated circuit chip, collectively define a control circuit as described herein.

The instruction execution module 14 is illustrated as including check bit generation and error correction logic therein. In some embodiments of the present invention, the check bit generation logic may be configured to generate check bits that support error detection and error correction operations, which may be performed independently inside and outside the CAM core 16. The check bit generation logic may be configured to generate a modified Hamming code word for each entry that is written into the CAM core 16. This modified Hamming code word may be attached to each entry when it is written into the CAM core 16 or stored in a separate check bit memory (not shown) that maps to each entry within the CAM core 16. The use of separate check bit memory is described more fully in commonly assigned U.S. application Ser. No. 10/619,635, filed Jul. 15, 2003. The modified Hamming code supports limited 4-bit error detection and 1-bit error correction operations. In particular, a maximum of four errors may be detected so long as the four errors are distributed over the Xe, Xo, Ye and Yo bits of an entry, as described below.

Figure 4B:
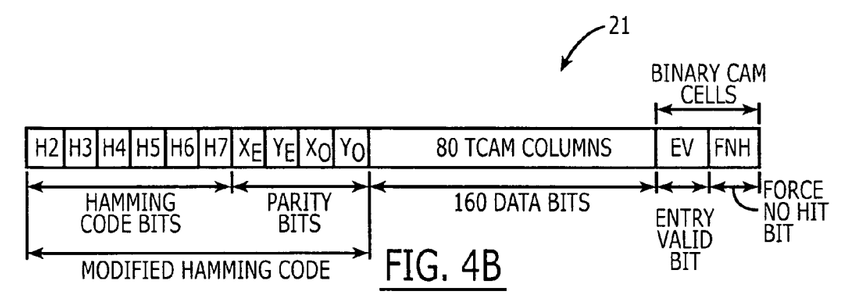
FIG. 4B illustrates the arrangement of modified Hamming code bits and data bits within a CAM entry, according to embodiments of the present invention.

The 80-bit wide CAM entry 21 of FIG. 4B is illustrated as including 80 ternary CAM (TCAM) cells, which support 160 bits of data in the form of 80 X-bits and 80 Y-bits. These TCAM cells may be configured as lateral XY CAM cells that are each coupled to two pairs of bit lines and one pair of data lines. The layout, electrical configuration and operation of such XY CAM cells are more fully described in commonly assigned U.S. application Ser. No. 10/609,756, filed Jun. 20, 2003, and U.S. application Ser. No. 10/386,400, filed Mar. 11, 2003, the disclosures of which are hereby incorporated herein by reference.

The CAM entry 21 is also illustrated as including an entry valid bit (EV) and a force no-hit bit (FNH). The entry valid bit (EV) is a searchable bit that may be set low to represent an invalid entry or set high to represent a valid entry. The force no-hit bit (FNH) may be set to force a corresponding entry to register a miss condition whenever a search operation is performed on the entry. An active FNH bit will also operate to cause all lower priority matching entries within the same CAM segment, if any, to register a miss condition(s). The entry valid bit (EV) and force no-hit bit (FNH) may be stored within binary CAM cells. Both of these bits can be used in the parity bit calculation, which means any operations to change these bits within an entry in the CAM core 16 may need to be accompanied by or followed by operations to correct the check bit information in the entry. Accordingly, if an EV bit is switched from a valid value to an invalid value to thereby age out a corresponding entry during CAM aging operations, for example, the check bits associated with the entry will also need to be updated. This will prevent a formerly aged out entry from subsequently being detected as erroneous and then corrected (i.e., reborn) by switching back the value of the EV bit. This correction of the check bit information when switching the EV bit to an invalid state can be achieved by writing a default entry with generic data and FNH values (e.g., all 0's), an invalid EV bit and check bits that are properly determined for these values. Operations to perform aging on CAM core entries is more fully illustrated and described in U.S. application Ser. No. 10/714,680, filed Nov. 14, 2003, the disclosure of which is hereby incorporated herein by reference.

The entry 21 of FIG. 4B is also illustrated as including ten (10) check bits that constitute a modified Hamming code word. These ten check bits include six standard Hamming code bits, shown as H2–H7, and four parity bits, shown as Xe, Ye, Xo and Yo, where "e" and "o" represent "even" and "odd", respectively. The 160 data bits within the entry 21 include 40 even X-bits (X0, X2, X4, . . . , and X78), 40 even Y-bits (Y0, Y2, Y4, . . . , and Y78), 40 odd X-bits (X1, X3, X5, . . . , and X79) and 40 odd Y-bits (Y1, Y3, Y5, . . . , and Y79).

The six Hamming code bits H2–H7 and four parity bits (Xe, Ye, Xo and Yo) may be generated within the check bit generation logic using circuitry that is configured to perform the following boolean operations:

H2=XOR(X[0,1,4–7,10,11,14,15,18–21,24–27,30,31,34,35, 38–41,44–47,50,51,54,55,58–61,64–67,70,71,74,75,78, 79], Y[0,1,4–7,10,11,14,15,18–21,24–27,30,31,34,35, 38–41,44–47,50,51,54,55,58–61,64–67,70,71,74,75,78, 79], FNH];

H3=XOR(X[2–5,8–11,16–19,22–25,28–31,36–39,42–45, 48–51,56–59,62–65,68–71,76–79], Y[2–5,8–11,16–19, 22–25,28–31,36–39,42–45,48–51,56–59,62–65,68–71, 76–79], EV);

H4=XOR(X[0–5,12–25,32–45, 52–65,72–79], Y[0–5, 12–25,32–45,52–65,72–79]);

H5=XOR(X[6–19,26–39,46–59,66–79], Y[6–19,26–39, 46–59,66–79]);

H6=XOR(X[20–39,60–79], Y[20–39,60–79]);

H7=XOR(X[40–79], Y[40–79]);

Xe=XOR(H4, X[0,2,4,6,8,10,12, . . . ,78], FNH);

Ye=XOR(H5, Y[0,2,4,6,8,10,12, . . . ,78]);

Xo=XOR(H2, H6, X[1,3,5,7,9,11,13, . . . ,79], EV); and

Yo=XOR(H3, H7, Y[1,3,5,7,9,11,13, . . . ,79]).

Figure 7:
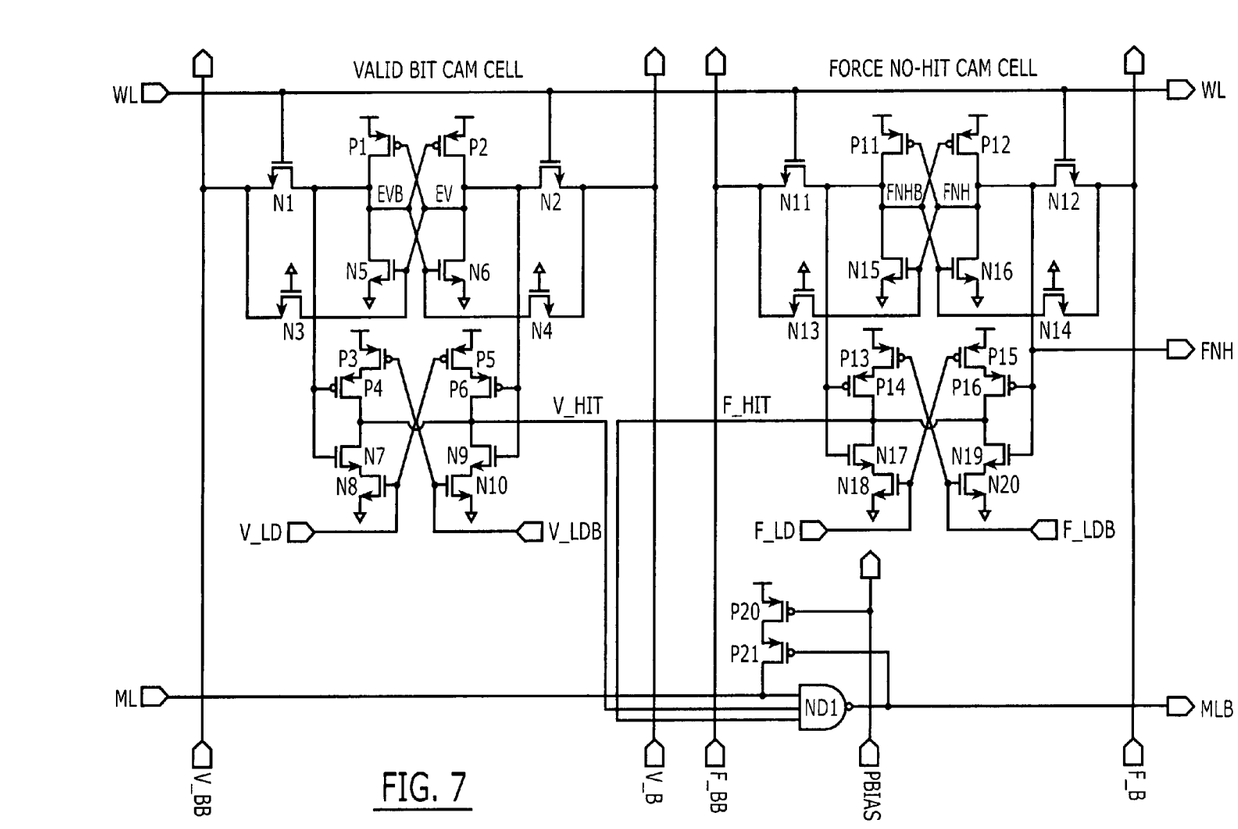
FIG. 7 is an electrical schematic of a valid bit CAM cell and a force no-hit CAM cell according to embodiments of the present invention.

A more detailed explanation of the characteristics and layout of the entry 21 within a segmented CAM array block is provided in U.S. application Ser. No. 10/701,048, filed Nov. 4, 2003. In addition, FIG. 7 illustrates an electrical schematic of the two binary CAM cells within the entry 21, which retain valid bit and force no-hit data. In this schematic, the valid bit CAM cell includes an eight transistor (8T) SRAM memory cell and an eight transistor compare logic circuit. The 8T SRAM memory cell includes a pair of NMOS access transistors N1 and N2, which have source terminals electrically connected to a pair of differential bit lines (V_B and V_BB), and a pair of inverters connected in antiparallel. The output of a first one of the inverters stores the true valid bit data value (EV) and the output of the second one of the inverters stores the complementary valid bit data value (EVB). The first one of the inverters is defined by PMOS pull-up transistor P2 and NMOS pull-down transistor N6. The second one of the inverters is defined by PMOS pull-up transistor P1 and NMOS pull-down transistor N5. Two dummy access transistors N3 and N4, which are always "off", are also provided to balance leakage currents in the memory cell. These dummy access transistors N3 and N4 add parasitic drain-to-gate capacitance to the storage nodes (i.e., outputs EV and EVB) and thereby improve the soft error susceptibility of the SRAM memory cell relative to the memory cells contained within the TCAM cells (e.g., XY CAM cells) illustrated by FIG. 4B herein and FIG. 6 of the aforementioned '635 application. This SRAM memory cell may also have a lower (or higher) susceptibility to soft errors relative to the dedicated check bit memory cells illustrated and described in the '635 application. Moreover, as illustrated and described more fully in U.S. Pat. No. 6,754,093 to Lien, which is hereby incorporated herein by reference, doped semiconductor layers may be used in combination with semiconductor well regions of transistors in CAM cells to inhibit soft errors.

The compare logic circuit within the valid bit CAM cell includes two totem pole arrangements of PMOS and NMOS transistors. A first one of the totem poles includes PMOS pull-up transistors P3 and P4 and NMOS pull-down transistors N7 and N8. A second one of the totem poles includes PMOS pull-up transistors P5 and P6 and NMOS pull-down transistors N9 and N10. The outputs of the first and second totem poles are joined together at a "hit" output terminal (shown as V_HIT). A pair of differential data lines, which receive search data during search operations, are also provided. This pair of differential data lines is shown as including a true data line V_LD and a complementary data line V_LDB. The true data line V_LD is connected to the gate terminals of the NMOS pull-down transistor N8 and the PMOS pull-up transistor P5. The complementary data line V_LDB is connected to the gate terminals of the NMOS pull-down transistor N10 and the PMOS pull-up transistor P3.

The force no-hit CAM cell on the right side of FIG. 7 also includes an eight transistor (8T) SRAM memory cell and an eight transistor compare logic circuit. The 8T SRAM memory cell includes a pair of NMOS access transistors N11 and N12, which have source terminals electrically connected to a pair of differential bit lines (F_B and F_BB), and a pair of inverters connected in antiparallel. The output of a first one of the inverters stores the true valid bit data value (FNH) and the output of the second one of the inverters stores the complementary valid bit data value (FNHB). The first one of the inverters is defined by PMOS pull-up transistor P12 and NMOS pull-down transistor N16. The second one of the inverters is defined by PMOS pull-up transistor P11 and NMOS pull-down transistor N15. Two dummy access transistors N13 and N14, which are always "off", are also provided to balance leakage currents in the memory cell. These dummy access transistors N13 and N14 add parasitic drain-to-gate capacitance to the storage nodes (i.e., outputs FNH and FNHB) and thereby improve the soft error susceptibility of the SRAM memory cell. As described above, a deep N-well semiconductor region (not shown) may be placed below the illustrated memory cell within the force no-hit CAM cell to thereby further reduce soft error susceptibility.

The compare logic circuit within the force no-hit CAM cell includes two totem pole arrangements of PMOS and NMOS transistors. A first one of the totem poles includes PMOS pull-up transistors P13 and P14 and NMOS pull-down transistors N17 and N18. A second one of the totem poles includes PMOS pull-up transistors P15 and P16 and NMOS pull-down transistors N19 and N20. The outputs of the first and second totem poles are joined together at a "hit" output terminal (shown as F_HIT). A pair of differential data lines, which receive search data during search operations, are also provided. This pair of differential data lines is shown as including a true data line F_LD and a complementary data line F_LDB. The true data line F_LD is connected to the gate terminals of the NMOS pull-down transistor N18 and the PMOS pull-up transistor P15. The complementary data line F_LDB is connected to the gate terminals of the NMOS pull-down transistor N20 and the PMOS pull-up transistor P13.

The "hit" output of the valid bit CAM cell and the "hit" output of the force no-hit CAM cell are provided as separate inputs to a three-input NAND gate ND1. A third input of the NAND gate ND1 is configured to receive a match line signal provided on a final segment of a match line ML. The NAND gate ND1 also generates an active low match signal MLB. Based on this configuration of the NAND gate ND1, the match signal MLB will only be active at a low level when the following condition is met: ML=V_HIT=F_HIT=1. Accordingly, during a search operation, it is necessary that the following two conditions be met before the "complementary" match line MLB will accurately reflect whether the searchable data stored within the entry 21 matches an applied search word: (i) the differential data provided on the data lines V_LD and V_LDB matches the values of the differential data (i.e., EV and EVB) stored within the valid bit memory cell, and (ii) the differential data provided on the data lines F_LD and F_LDB matches the values of the differential data (i.e., FNH and FNHB) stored within the corresponding force no-hit memory cell. An output of the NAND gate ND1 is also coupled to a PMOS pull-up transistors P21, which is electrically coupled to a power supply voltage (e.g., Vdd) by a PMOS pull-up transistor P20. This PMOS pull-up transistor is a normally-on transistor having an on-state conductivity set by a bias voltage (PBIAS). As described more fully in commonly assigned U.S. Pat. No. 6,775,168, the PMOS pull-up transistors P20 and P21 collectively form a match line precharge support circuit.

Figure 5A:
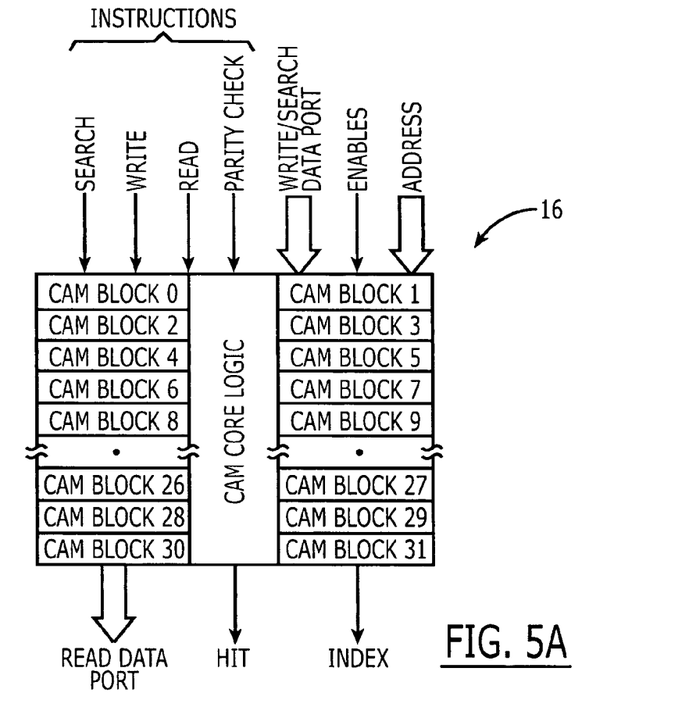
FIG. 5A is a block diagram of a CAM core according to embodiments of the present invention.

Communication to and from the CAM core 16 of FIG. 3 is made by the CAM core instruction and result interfaces. As illustrated by FIG. 5A, the CAM core instruction interface is configured to support communication of various instructions to the CAM core 16. These instructions are illustrated as search, write, read and parity check. Other instructions (not shown) may also be provided (e.g., learn, search and learn (SNL), clear valid, etc.). The incoming data port to the CAM core is accompanied by an address port, which may pass a write address (e.g., block and row addresses) to the CAM core during write operations. The CAM core 16 is also responsive to various enable signals.

The CAM core result interface is configured to generate one or more hit signals, which indicate the presence of matching entries within the CAM core 16 during search operations, and index data that identifies addresses of matching entries. The result interface is also configured with a read data port, as shown. As described more fully hereinbelow, this read data port may be used as a multi-function port that is active during parity check operations.

Figure 5B:
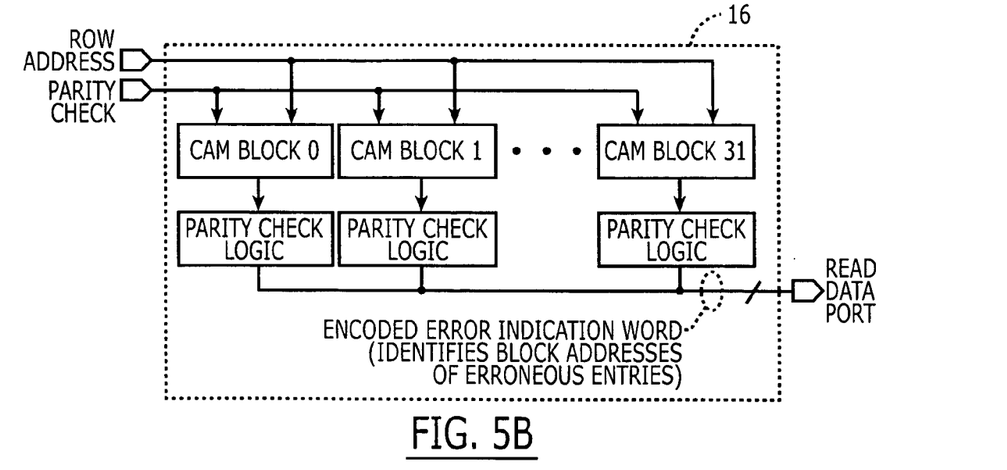
FIG. 5B is a block diagram of a CAM core having error detection logic therein, according to embodiments of the present invention.

As illustrated by FIG. 5B, the CAM core logic within the CAM core 16 of FIG. 5A combines parity check logic circuits that are associated with each CAM array block. In response to a parity/error check instruction and multi-block row address issued by the instruction execution module 14, a read operation is performed in parallel from the CAM array blocks. If the CAM core 16 is configured in a 1/1 parity check mode, then this read operation will be performed in parallel from all of the 32 blocks. In contrast, programming the CAM core 16 to support a ½ or ¼ parity check mode will cause the parity check read operation to be performed in parallel from 16 or 8 of the 32 CAM array blocks, respectively. For purposes of discussion herein, only the 1/1 parity check mode will be considered.

In response to the parallel read operation, two entries 21 (left and right) from each CAM array block will be read into the parity check logic circuits associated with each CAM array block. The parity check logic circuits will generate a parity result (PARITY RESULT) upon receipt of each entry 21. The parity result may be determined using logic that performs the following boolean operations:

PARITY RESULT=OR (XP0, XP1, YP0, YP1);
XP0=XOR(H4, Xe, X0, X2, X4, X6, . . . , X78, FNH);
XP1=XOR(H2, H6, Xo, X1, X3, X5, X7, . . . , X79, EV);
YP0=XOR(H5, Ye, Y0, Y2, Y4, Y6, . . . , Y78); and
YP1=XOR(H3, H7, Yo, Y1, Y3, Y5, Y7, . . . , Y79).

Each parity check logic circuit in the illustrated CAM core 16 of FIG. 5B generates two parity result bits. One of these is for the left side CAM array within a corresponding CAM array block and the other of these is for the right side CAM array within the corresponding CAM array block. Different CAM array blocks having only one or more than two CAM arrays therein can be used to generate a different number of parity result bits. Moreover, in alternative embodiments, the parallel read operation may cause only one entry to be read from either the left side CAM array or right side CAM array within the group of CAM array blocks. In this case, the read address accompanying the parallel read operation may specify either the right CAM array or left CAM array, along with a row address. Nonetheless, two parity result bits may be generated for each left or right entry. These two bits of parity result may be computed as:

PARITY RESULT=(OR (XP0, XP1), OR (YP0, YP1)).

In this manner, the two bits of parity result that are generated from an entry will indicate whether the error is in the X bits, Y bits, or both X and Y bits. This indication of X bit or Y bit error may be useful when reporting erroneous entries to the command host.

Figure 5C:
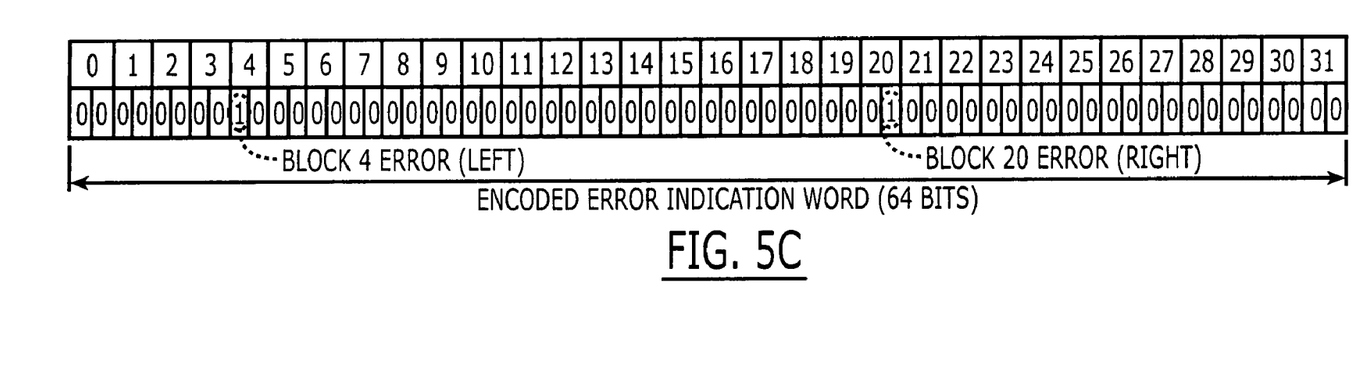
FIG. 5C illustrates the arrangement of data within an encoded error indication word that may be generated by the CAM core of FIG. 5B when an error check instruction is issued to the CAM core.

As illustrated by FIGS. 5B–5C, these parity result bits are encoded into a 64-bit error indication word, which is passed to a read data port of the CAM core 16. This eliminates the need to pass all 64 entries in sequence across the read data port. The encoded error indication word of FIG. 5C, which is provided as an example, indicates the presence of parity errors in two entries within the 32 CAM array blocks (from the designated row address). These entries include an entry from the left side of CAM block 4 and an entry from the right side of CAM block 20. Alternatively, in the event two bits of parity result are generated from an entry undergoing parity checking, then the encoded error indication word of FIG. 5C may indicate an X-bit error in an entry from CAM block 4 and a Y-bit error in an entry from CAM block 20.

Figure 5D:
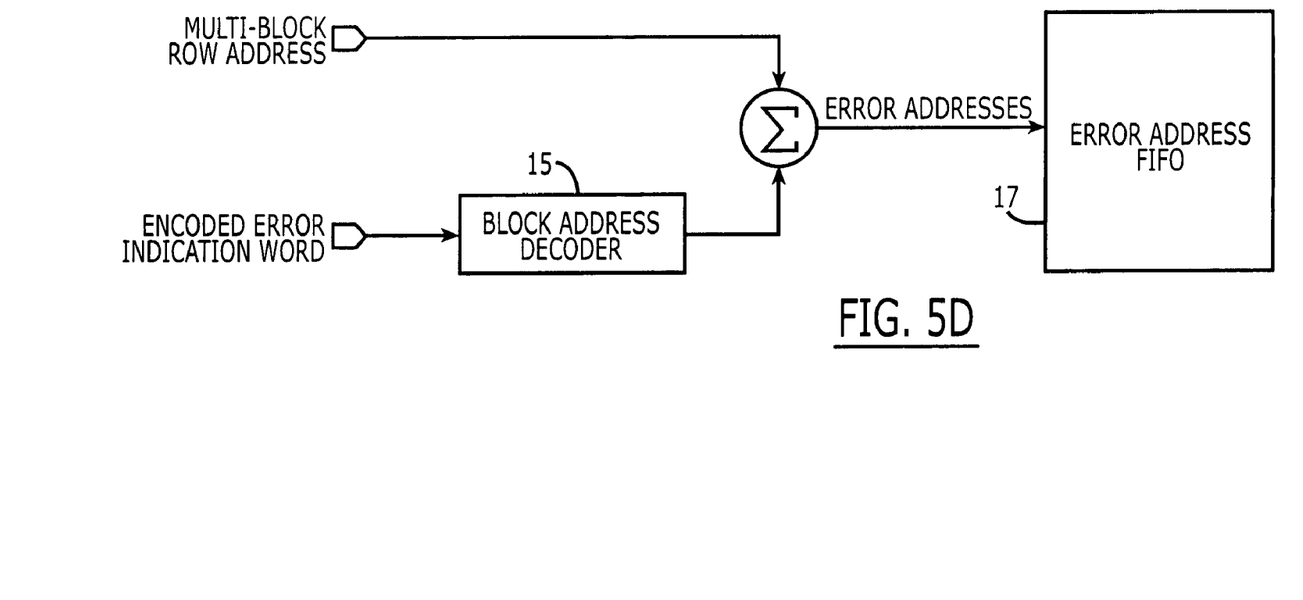
FIG. 5D is a block diagram of circuit elements within an error correction logic circuit, according to embodiments of the present invention.

Referring again to FIG. 3, this encoded error indication word is passed to the result module 18 and then fed back to the instruction execution module 14 where it is decoded. As illustrated by FIG. 5D, which illustrates a portion of the logic within the instruction execution module 14, the encoded error indication word is received by a block address decoder 15. This block address decoder looks for active bits within the encoded error indication word and generates the block addresses of the CAM array blocks having erroneous entries therein. In the illustrated embodiment, these block addresses may include an array address, which identifies whether a left or right CAM array within a block contains an erroneous entry. These addresses are combined with the multi-block row address that was previously generated when the parity check instruction was issued by the instruction execution module 14, to thereby generate a row address of each erroneous entry within a corresponding CAM array (left or right). These row addresses are stored within an error address memory device 17, which is illustrated as a FIFO memory device. As described more fully hereinbelow, this FIFO memory device may be a searchable memory device that can be used to prevent conflicts when write operations are performed into addresses containing erroneous entries. Alternatively, the encoded error indication word may be stored in a register and then checked and updated for the presence of any remaining erroneous addresses. (See, e.g., Block 606 in FIG. 6, where the check of an error address FIFO may be replaced by a check of the register).

The error detection and correction operations 600 performed by the search engine device 10 of FIGS. 3–4 and 5A–5D include a check by the instruction execution module 14 to determine whether an incoming instruction pipeline has an opening therein that can support the insertion of a CAM core instruction. This check is made at Block 602 in FIG. 6. When this check results in an affirmative answer, control is passed to Block 604. At Block 604, a check is made to determine whether any corrected entry is pending in the instruction execution module for insertion into the CAM core 16. If this check results in a negative answer, control is passed to Block 606. At Block 606, a check is made as to whether the error address FIFO 17 within the instruction execution module is empty. If this check results in an affirmative answer, then a multi-block row address counter (not shown) within the instruction execution module 14, is incremented, Block 608. Upon reset of the search engine device, this counter may be reset to a zero count.

Figure 6:
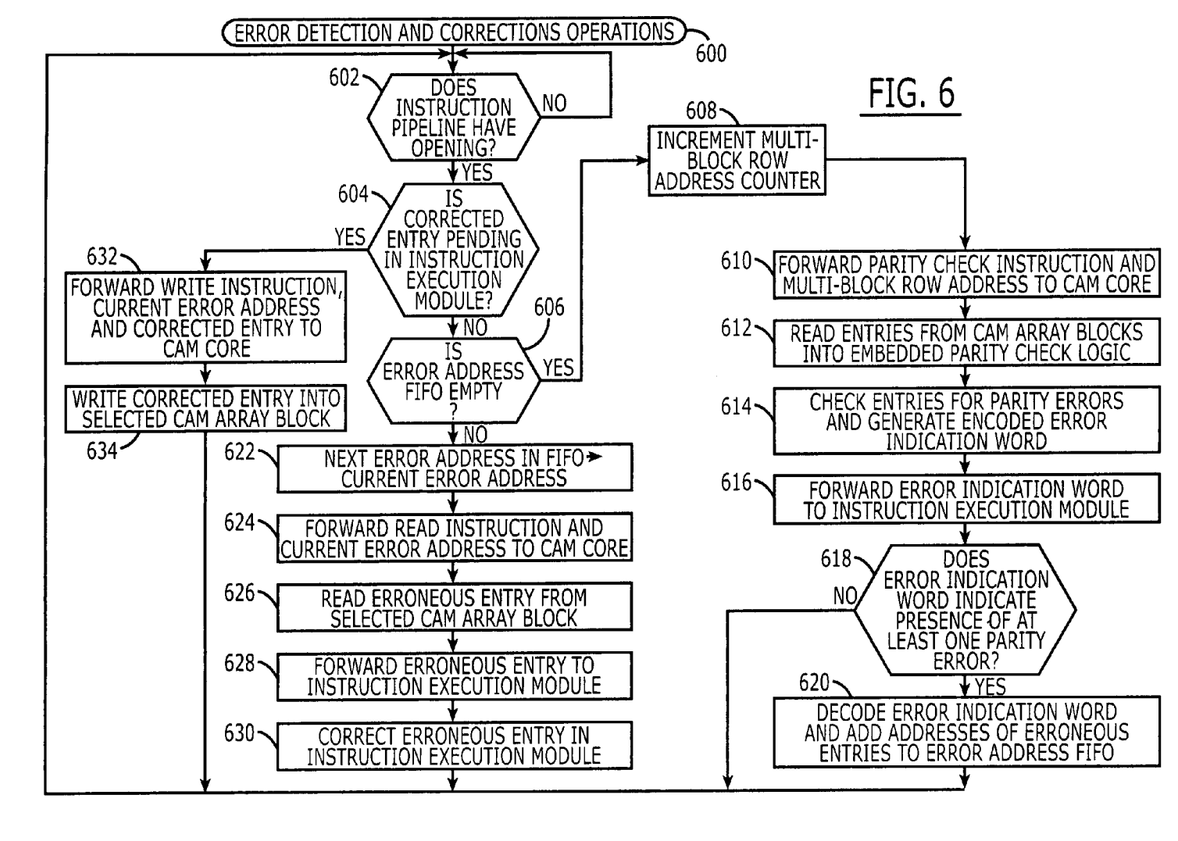
FIG. 6 is a flow diagram of operations that illustrate methods of performing error detection and correction operations within a search engine device, according to embodiments of the present invention.

As illustrated by Block 610, a parity check instruction and the counter value (row address) are forwarded to the CAM core 16. In response to this parity check instruction, a plurality of entries are read in parallel from the CAM array blocks into the parity check logic that is embedded within the CAM core 16, Block 612. In the embodiments described above, this parity check read operation results in the parallel transfer of 64 entries 21 into the parity check logic. (See, e.g., FIG. 5B). At Block 614, the entries are checked for parity errors and the parity results are passed as an encoded error indication word to the read data port. The encoded error indication word is then forwarded from the result module 18 to the instruction execution module, Block 616.

If the error indication word indicates the presence of one or more parity errors when it is initially processed by the block address decoder 15, Block 618, then it is decoded into one or more corresponding addresses. The addresses of the erroneous entries are then added to the error address FIFO 17, Block 620, and control is returned to Block 602. If the error indication word does not indicate at least one error at Block 618, then control is returned directly to Block 602 without any further processing of the error indication word.

Once control is returned to Block 602 and an opening in the instruction pipeline is detected, a check is made to determine whether there are any corrected entries pending in the instruction execution module, Block 604. If the answer is no, then a check is made at Block 606 to determine whether the error address FIFO 17 is empty. Assuming that the two entry errors illustrated by FIG. 5C were detected when Block 618 was originally encountered, then this check at Block 606 will result in a negative conclusion and control will be passed to Block 622. At Block 622, the next available error address within error address FIFO 17 is designated as the current error address. This error address and read instruction are then passed to the CAM core, Block 624. At Block 626, the previously detected erroneous entry is then read from the selected CAM array block and passed to the read data port of the CAM core 16. In some embodiments, this read instruction may constitute a "read-set-invalid" instruction that results in a read of the entry and simultaneously causes the valid bit in the entry to be set to an invalid value. This will remove the invalid entry from the search path within the CAM core 16 until it is subsequently corrected and rewritten. Alternatively, the read instruction may be treated as a multi-cycle instruction, which includes a set-invalid operation to invalidate the entry and then a subsequent read operation to read the erroneous entry and pass it to the read port. The performance of the set-invalid operation before the read operation operates to remove the erroneous entry from the search path as soon as practical.

The erroneous entry is then forwarded by the result module 18 to the instruction execution module 14, Block 628. At Block 630, the erroneous entry is evaluated further for the presence of errors and corrected by the error correction logic within the instruction execution module 14 if possible. These error correction operations identified by Block 630 may be performed as background operations without impacting the compare bandwidth of the search engine device 10.

Thereafter, the corrected entry is stored in a buffer memory (not shown) in the instruction execution logic 14 pending rewriting into the CAM core 16. As described above, the four bits of parity associated with each entry in the CAM core 16 support the detection of as many as four parity errors. Each of these parity bits, Xe, Ye, Xo and Yo, is a function of the data bits and at least some of the Hamming code bits H2–H7. For example, the parity bit Xe is a function of the even X bits, the FNH bit and Hamming code bit H4, as illustrated above. The parity bit Yo is a function of the odd Y bits and Hamming code bits H3 and H7. The functions performed by the parity bits and Hamming code bits may also be combined as a check word to support the correction of a single bit error within the entry. If desired, a greater number of check bits can be used in some embodiments to support correction of a greater number of errors. In the event the parity checking operation indicates the presence of two or as many as four errors within the entry 21 that cannot be corrected, then the entry 21 and its address within the CAM core 16 may be reported to the command host for further processing and the entry 21 may be invalidated within the CAM core 16. These reporting operations may also apply to erroneous entries that are subject to correction. These reporting operations may be facilitated by the use of an error FIFO that retains the erroneous entries and/or their addresses. This error FIFO may be subject to periodic reading operations by the command host.

After the operations of Block 630, control is passed back to Blocks 602 and 604. Accordingly, upon detection of an opening (e.g., no-op cycle) within the instruction pipeline, the check of whether a corrected entry is pending results in an affirmative answer, Block 604, and control is passed to Block 632. The corrected entry, corresponding address and a write instruction are then passed to the CAM core 16. In response, the corrected entry is written over the corresponding erroneous entry in the designated CAM array block, Block 634, and the address is removed from the error address FIFO 17. Operations (not shown) may also be performed to compare each incoming write address (e.g., those issued by a command host) against the entries of the error address FIFO 17 to detect a match. If a match is present, the externally generated write instruction is submitted to the CAM core 16 and the matching address within the error address FIFO 17 is removed so that no overwrite operation to correct an "erroneous" entry is performed on a newly written entry. In this manner, the error address FIFO 17 operates as a searchable cache memory. Similar compare operations may also be performed with respect to an incoming read address. In the event a match is detected, the corresponding read operation may be suspended until such time as the erroneous entry has been corrected. Alternatively, the read operation may be marked so that any read result will be accompanied by a flag or other indication that the entry is erroneous.

Upon completion of the write operation illustrated by Block 634, control is passed to Block 602 and the sequence of operations is repeated. In particular, control is again passed through Blocks 602, 604 and 606 and the next error address in the FIFO is set as the current error address, Block 622. The operations associated with Blocks 624–630 are then performed and the error address FIFO 17, which was originally filled with two addresses as described above, is emptied. Control is then passed through Blocks 602, 604, 606 to Block 608 where the multi-block row address counter is incremented before performing the next parity check operation and repeating the above described operations in sequence for all of the rows (e.g., 2048 rows in FIG. 4A) within the CAM array blocks.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
    a CAM array having at least one row therein comprising:
        at least one ternary CAM cell having two memory cells therein with equivalent susceptibilities to soft errors; and
        a valid bit memory cell having a lower susceptibility to soft errors relative to the memory cells in the at least one ternary CAM cell.

2. The device of claim 1, wherein the valid bit memory cell comprises at least one dummy access transistor that adds parasitic capacitance to a storage node therein.

3. An integrated circuit device, comprising:
    a CAM array having at least one row therein comprising:
        at least one ternary CAM cell having two memory cells therein with equivalent susceptibilities to soft errors; and
        a first binary CAM cell having a valid bit memory cell therein with a lower susceptibility to soft errors relative to the memory cells in the at least one ternary CAM cell.

4. The device of claim 3, wherein the at least one row of said CAM array further comprises a second binary CAM cell having a force no-hit memory cell therein with a lower susceptibility to soft errors relative to the memory cells in the at least one ternary CAM cell.

5. The device of claim 4, further comprising a NAND logic gate having a first input terminal electrically coupled by a match line to a compare logic output of the at least one ternary CAM cell, a second input terminal electrically coupled by a valid_hit line to a compare logic output of the first binary CAM cell and a third input terminal electrically coupled by a force_hit line to a compare logic output of the second binary CAM cell.

6. The device of claim 3, wherein the valid bit memory cell is an 8T memory cell.

7. The device of claim 6, wherein said first binary CAM cell comprises an 8T compare logic circuit therein with four PMOS transistors and four NMOS transistors.

8. The device of claim 6, wherein said first binary CAM cell comprises an 8T compare logic circuit arranged as a first totem pole of two PMOS transistors and two NMOS transistors and a second totem pole of two PMOS transistors and two NMOS transistors.

9. The device of claim 3, wherein the valid bit memory cell comprises at least one dummy access transistor that adds parasitic capacitance to a storage node therein.

10. A content addressable memory (CAM) cell, comprising:
    a pair of inverters electrically coupled in antiparallel;
    a first access transistor having a drain terminal electrically coupled to an input of a first one of said pair of inverters;
    a second access transistor having a drain terminal electrically coupled to an input of a second one of said pair of inverters;
    a first dummy access transistor having a drain terminal electrically coupled to the input of the second one of said pair of inverters and a source terminal electrically coupled to a source terminal of said first access transistor;
    a second dummy access transistor having a drain terminal electrically coupled to the input of the first one of said pair of inverters and a source terminal electrically coupled to a source terminal of said second access transistor; and
    a compare logic circuit comprising a first NMOS transistor having a gate terminal electrically coupled to the input of the first one of said pair of inverters and a second NMOS transistor having a gate terminal electrically coupled to the input of the second one of said pair of inverters.

11. The CAM cell of claim 10, wherein gate terminals of said first and second dummy access transistors are biased at fixed voltages that maintain said first and second dummy access transistors in a normally-off condition.

12. The CAM cell of claim 10, wherein said compare logic comprises a first PMOS transistor having a gate terminal electrically coupled to the input of the first one of said pair of inverters and a second PMOS transistor having a gate terminal electrically coupled to the input of the second one of said pair of inverters.

* * * * *